(12) United States Patent
Gasparyan et al.

(10) Patent No.: US 9,529,957 B1
(45) Date of Patent: Dec. 27, 2016

(54) MULTITHREADED SCHEDULING FOR PLACEMENT OF CIRCUIT DESIGNS USING CONNECTIVITY AND UTILIZATION DEPENDENCIES

(71) Applicant: Xilinx, Inc., San Jose, CA (US)

(72) Inventors: Grigor S. Gasparyan, San Jose, CA (US); Xiao Dong, San Jose, CA (US); Marvin Tom, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 19 days.

(21) Appl. No.: 14/606,988

(22) Filed: Jan. 27, 2015

(51) Int. Cl.
*G06F 17/50* (2006.01)

(52) U.S. Cl.
CPC .................. *G06F 17/5072* (2013.01)

(58) Field of Classification Search
CPC .................................. G06F 17/5072
See application file for complete search history.

(56) References Cited

U.S. PATENT DOCUMENTS

| | | | | |
|---|---|---|---|---|
| 6,536,024 B1* | 3/2003 | Hathaway | ........... | G06F 17/5045 327/295 |
| 6,684,376 B1* | 1/2004 | Kerzman | ............ | G06F 17/5072 716/124 |
| 6,910,200 B1* | 6/2005 | Aubel | .................. | G06F 17/505 703/13 |
| 9,164,969 B1* | 10/2015 | Gumaste | ............ | G06F 17/2247 |
| 2004/0083475 A1* | 4/2004 | Todd | ..................... | G06F 9/5005 718/102 |

OTHER PUBLICATIONS

Ludwin, A. et al., "Efficient and Deterministic Parallel Placement for FPGAs," In ACM Trans. on Design Automation of Electronic Systems (TODAES), vol. 16, No. 3, Art. 22, 4 pg., Jun. 2011, Altera Corporation, USA.
Viswanathan, N. et al., "FastPlace: Efficient Analytical Placement Using Cell Shifting, Iterative Local Refinement, and a Hybrid Net Model," In IEEE Trans. on Computer-Aided Design of Integrated Circuits and Systems, vol. 24, No. 5, pp. 722-733, May 2005, USA.

* cited by examiner

*Primary Examiner* — Vuthe Siek
(74) *Attorney, Agent, or Firm* — Kevin T. Cuenot

(57) ABSTRACT

Placing a circuit design may include partitioning circuit elements of the circuit design into circuit element sets and grouping bins of an integrated circuit into bin sets. The bins include circuit elements of the circuit design from an initial placement. Placing a circuit design also may include determining a dependency connectivity metric for the circuit elements and, using a processor, selectively relocating circuit elements concurrently, for a plurality of iterations, using a cost metric for relocating the circuit elements and using an order of processing the circuit elements determined from the bin sets, the circuit element sets, and the dependency connectivity metrics.

20 Claims, 5 Drawing Sheets

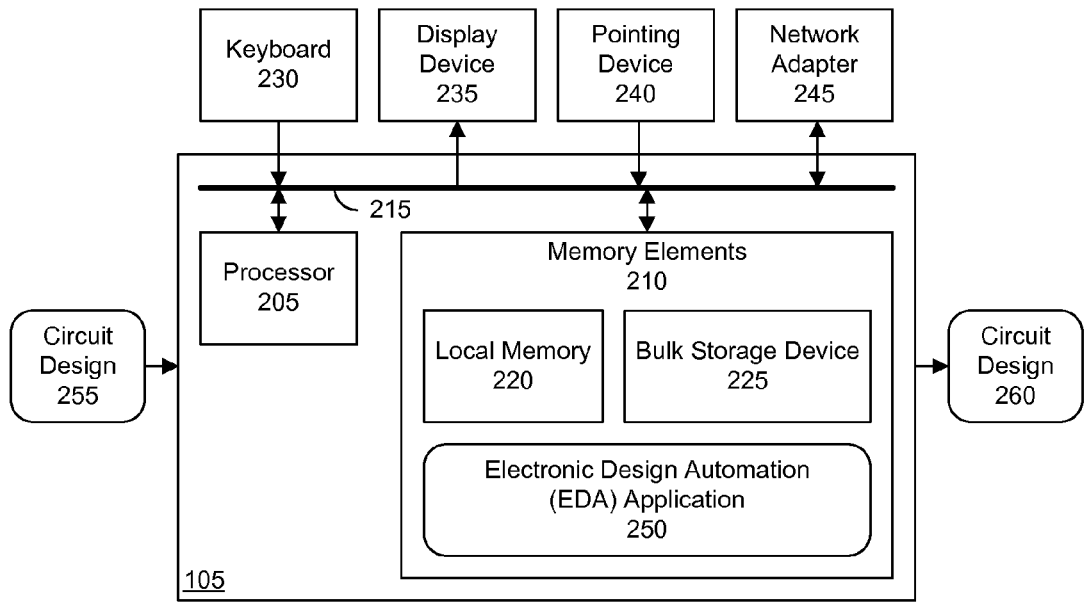
FIG. 2
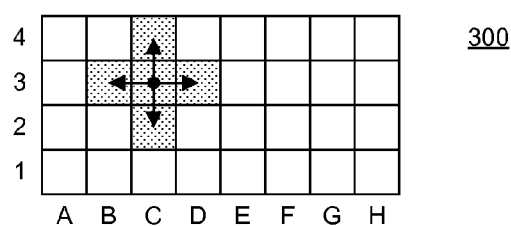
FIG. 3
| G | H | E | F | G | H | E | F |
|---|---|---|---|---|---|---|---|
| C | D | A | B | C | D | A | B |
| E | F | G | H | E | F | G | H |
| A | B | C | D | A | B | C | D |
300
FIG. 4

MULTITHREADED SCHEDULING FOR PLACEMENT OF CIRCUIT DESIGNS USING CONNECTIVITY AND UTILIZATION DEPENDENCIES

FIELD OF THE INVENTION

This disclosure relates to integrated circuits (ICs) and, more particularly, to placing circuit designs using a multithreaded scheduling technique.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

In order to implement a circuit design within an IC, including a programmable IC, the circuit design is processed through a design flow using one or more electronic design automation tools. The design flow includes several different phases including, for example, synthesis, technology mapping, placement, and routing. Synthesis generally refers to the process of translating an abstract behavioral description of the circuit design into a netlist of gates. Technology mapping refers to the process of mapping the gate level netlist to the circuit elements of a particular IC used to implement the circuit design called the target IC. Technology mapping generates a technology specific netlist. Placement generally refers to the process of assigning the various circuit elements of the circuit design to locations on the target IC. Routing refers to the process of coupling the circuit elements assigned to locations on the target IC with wires.

The placement phase may be implemented in two parts referred to as global placement and detailed placement. Global placement attempts to assign circuit elements to locations using one or more different metrics such as wire length, timing, congestion, etc. Detailed placement attempts to optimize the global placement solution using one or more different optimization techniques such as, for example, simulated annealing.

SUMMARY

A method of placing a circuit design may include partitioning circuit elements of the circuit design into circuit element sets, grouping bins of an IC into bin sets, wherein the bins include circuit elements of the circuit design from an initial placement, and determining a dependency connectivity metric for the circuit elements. The method also may include, using a processor, selectively relocating circuit elements concurrently, for a plurality of iterations, using an order of processing the circuit elements determined from the bin sets, the circuit element sets, and the dependency connectivity metrics.

A system may include a processor programmed to initiate executable operations. The executable operations may include partitioning circuit elements of the circuit design into circuit element sets, grouping bins of an IC into bin sets, wherein the bins comprise circuit elements of the circuit design from an initial placement, and determining a dependency connectivity metric for the circuit elements. The executable operations may also include selectively relocating circuit elements concurrently, for a plurality of iterations, using an order of processing the circuit elements determined from the bin sets, the circuit element sets, and the dependency connectivity metrics.

A non-transitory computer-readable storage medium includes instructions stored thereon which, when executed by a processor, perform a method. The method may include partitioning circuit elements of the circuit design into circuit element sets, grouping bins of an IC into bin sets, wherein the bins include circuit elements of the circuit design from an initial placement, and determining a dependency connectivity metric for the circuit elements. The method may also include selectively relocating circuit elements concurrently, for a plurality of iterations, using an order of processing the circuit elements determined from the bin sets, the circuit element sets, and the dependency connectivity metrics.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 2 is a block diagram illustrating an exemplary data processing system.

FIG. 3 illustrates legal movements of a circuit element during an iteration of a placement process.

FIG. 4 illustrates the exemplary IC of FIG. 3 with bins grouped into bin sets.

DETAILED DESCRIPTION OF THE DRAWINGS

Figure 1:
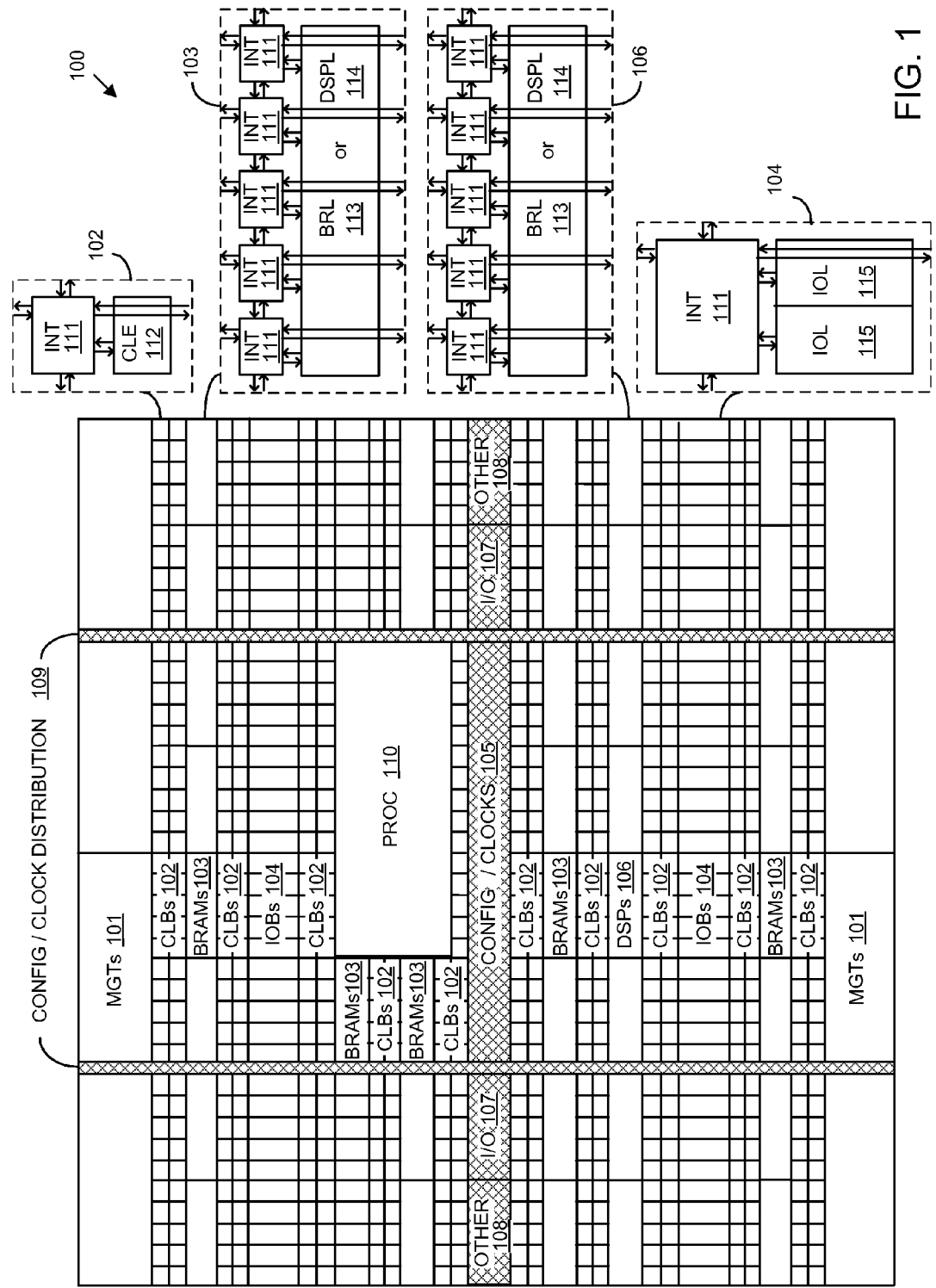
FIG. 1 is a block diagram illustrating an exemplary architecture for an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to placing circuit designs using a multi-threaded scheduling technique. The scheduling technique utilizes, at least in part, connectivity and utilization dependencies. In accordance with the inventive arrangements disclosed herein, a multithreaded scheduling technique may be used during the placement phase of a design flow performed on a circuit design. The multithreaded scheduling technique may be applied during global placement of the placement phase.

In one aspect, an Iterative Local Refinement (ILR) technique may be used during placement. The multithreaded scheduling technique may be used as part of the ILR technique. Using multithreaded scheduling that incorporates connectivity and utilization dependencies within the context of ILR may reduce the amount of processing time, e.g., runtime, needed to perform placement. The multithreaded scheduling technique may also increase the quality of the resulting placement of the circuit design.

Within conventional placers, the scheduler typically schedules operations using a static, connectivity dependence metric. The scheduler is able to utilize multithreading for selected placement operations albeit in a somewhat limited manner. For example, a conventional placer having a scheduler that relies upon connectivity dependence may apply multithreading to operations that only involve timing costs and/or that only involve wire length costs. One result is that the placer is unable to scale adequately as circuit designs grow larger.

In accordance with the inventive arrangements disclosed herein, an additional metric, referred to as "utilization dependency," is used in combination with connectivity dependence. Whereas connectivity dependence is static since connections among circuit elements of a circuit design do not change, utilization dependency is dynamic. Utilization dependence is derived from the particular region, e.g., bin, in which circuit elements reside. As the location of circuit elements changes throughout iterations of the placement process, the utilization dependence is a dynamic metric. Accordingly, using connectivity dependence in combination with utilization dependency allows the scheduler to increase the number of processing threads that are used beyond current limitations.

For example, a conventional placer with a scheduler that relies upon connectivity dependence alone may be constrained to a maximum of four (4) threads. A placer with a scheduler that utilizes both connectivity dependence and utilization dependencies may scale up to eight (8) threads resulting in approximately a 1.5 speed increase over conventional placers.

The inventive arrangements described within this disclosure may be implemented as a method or process performed by a data processing system. In another aspect, the inventive arrangements may be implemented as a data processing system having a processor. The processor, upon executing program code, operates upon a circuit design to perform placement of the circuit design as described herein. In still another aspect, the inventive arrangements may be implemented as a non-transitory computer-readable storage medium storing program code that, when executed, causes a processor and/or a system to perform and/or initiate a method or process of placing a circuit design.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary architecture 100 for an IC. In one aspect, architecture 100 is implemented within a programmable IC. For example, architecture 100 may be used to implement a field programmable gate array (FPGA). Architecture 100 is also representative of an SOC type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As pictured, architecture 100 includes several different types of programmable circuit, e.g., logic, blocks. For example, architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 may include a configurable logic element (CLE) 112 that may be programmed to implement user logic plus a single INT 111. A BRAM 103 may include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also may be used. A DSP tile 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, may be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks may be programmable blocks and/or dedicated circuitry. For example, a processor block depicted as PROC 110 spans several columns of CLBs and BRAMs.

In one aspect, PROC 110 is implemented as a dedicated circuitry, e.g., as a hardwired processor, that is fabricated as part of the die that implements the programmable circuitry of the IC. PROC 110 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks may be utilized to form a "soft processor" in that the various blocks of programmable circuitry may be used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 1 that are external to PROC 110 such as CLBs 102 and BRAMs 103 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 110 or a soft processor. In some cases, architecture 100 includes a dedicated configuration processor that loads the configuration bitstream to the appropriate configuration memory and/or processor memory. The dedicated configuration processor does not execute user-specified program code. In other cases, architecture 100 may utilize PROC 110 to receive the configuration bitstream, load the configuration bitstream into appropriate configuration memory, and/or extract program code for execution.

FIG. 1 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 110 within the IC are for purposes of illustration only and are not intended as limitations.

FIG. 2 is a block diagram illustrating an exemplary data processing system (system) 200. System 200 includes at least one processor, e.g., a central processing unit (CPU), 205 coupled to memory elements 210 through a system bus 215 or other suitable circuitry. System 200 stores program code within memory elements 210. Processor 205 executes the program code accessed from memory elements 210 via system bus 215. In one aspect, system 200 is implemented as a computer or other data processing system that is suitable for storing and/or executing program code. System 200 may be implemented, however, as any of a variety of systems including a processor and memory that is capable of performing the functions described within this disclosure. Further, system 200 may be implemented as one or more networked data processing systems.

Memory elements 210 include one or more physical memory devices such as, for example, a local memory 220 and one or more bulk storage devices 225. Local memory 220 refers to random access memory (RAM) or other non-persistent memory device(s) generally used during actual execution of the program code. Bulk storage device 225 may be implemented as a hard disk drive (HDD), a solid state drive (SSD), or as another persistent data storage device. System 200 may also include one or more cache memories (not shown) that provide temporary storage of at least some program code in order to reduce the number of times program code must be retrieved from bulk storage device 225 during execution.

Input/output (I/O) devices such as a keyboard 230, a display device 235, and a pointing device 240 may optionally be coupled to system 200. The I/O devices may be coupled to system 200 either directly or through intervening I/O controllers. A network adapter 245 may also be coupled to system 200 to enable system 200 to become coupled to other systems, computer systems, remote printers, and/or remote storage devices through intervening private or public networks. Modems, cable modems, Ethernet cards, and wireless transceivers are examples of different types of network adapter 245 that may be used with system 200.

As pictured in FIG. 2, memory elements 210 store an electronic design automation (EDA) application 250. EDA application 250, being implemented in the form of executable program code, is executed by system 200. As such, EDA application 250 is considered an integrated part of system 200. System 200, while executing EDA application 250, receives and operates upon a circuit design 255. In one aspect, EDA application 250 may be implemented as a single, integrated program having one or more program code modules. For example, one of the program code modules may implement a placer. In another aspect, EDA application 250 may be implemented as a plurality of applications that execute cooperatively with another. For example, one of the applications may be a placer.

Circuit design 255 is a programmatic description of circuitry to be implemented within an IC. For example, circuit design 255 may be specified using a hardware description language (HDL), as a netlist, as a configuration bitstream, a combination thereof, or the like. In one aspect, circuit design 255 is not yet placed. For example, circuit design 255 may have undergone synthesis and technology mapping as part of a design flow performed by system 200 or as performed by another system.

System 200, in executing EDA application 250, operates upon circuit 255 to perform placement. As noted, placement may include global placement and/or detailed placement. System 200, in performing placement operations, assigns locations or sites of a target IC to the circuit elements of circuit design 255. The target IC is the particular IC used to implement circuit design 255. In one aspect, the target IC may have an architecture the same as or similar to that of architecture 100 of FIG. 1. Regardless of the particular target IC used, the target IC has a specific, known architecture.

EDA application 250 may include a scheduler, or scheduler module, that is configured for multithreaded operation while performing placement operations. Subsequent to performing one or more placement operations, system 200 outputs circuit design 260. Circuit design 260 includes location information for the circuit elements specified therein.

EDA application 250, circuit design 255, circuit design 260, and any data items used, generated, executed, and/or operated upon by system 200 in performing placement operations are functional data structures. The functional data structures impart functionality when employed as part of system 200 or when such elements, including derivations thereof, are loaded into an IC such as a programmable IC.

In one aspect, a placement may begin with a global placement process. Circuit elements of circuit design 255 may be initially distributed across the target IC by assigning locations to the circuit elements. The initial placement may be random or performed using one or more metrics such as wire length, timing, and/or a combination thereof. The placement process may start with each circuit element being assigned an initial location. The placement of circuit elements, however, may or may not be a legal placement. For example, two or more circuit elements may be assigned to overlapping or same locations. During global placement, the circuit elements may be moved in accordance computed costs. In one aspect, the particular technique used for performing global placement may be one that uses ILR.

FIG. 3 is a block diagram illustrating an exemplary IC 300 divided into bins. Each bin is rectangular in shape. In the example of FIG. 3, each bin is square in shape. As defined herein, the term "bin" means a rectangular region of the target IC for a circuit design undergoing placement. In one aspect, bins may be measured or sized in terms of a number of available sites for circuit elements, programmable circuit blocks, or the like within the bins, e.g., using such features as measures of height and/or width. Within FIG. 3, the bins of IC 300 may be referenced using the letters along bottom edge and the numbers along the left edge. For example, the bin located in the lower left corner of IC 300 is referred to as bin A1, while the bin located in the upper right corner of IC 300 is referred to as bin H4.

FIG. 3 illustrates legal movements of a circuit element during an iteration of a placement process. For purposes of illustration, consider the case where a circuit element is assigned to bin C3, which is shaded. The circuit element, as part of the placement process, and, more particularly, the global placement process, may be moved only to other shaded bins. Thus, a circuit element located in bin C3 may only be moved up to bin C4, down to bin C2, left to bin B3, or right to bin D3. The circuit element also may remain in bin C3. The particular bin where the circuit element is moved depends upon the cost that is calculated for the proposed relocation of the circuit element. For example, the circuit element of bin C3 may be moved to the bin, i.e., bin C4, bin C2, bin B3, bin D3, or remain in bin C3, that has the lowest cost of the available, legal moves.

As defined within this specification, the term "utilization dependent," in reference to a plurality of bins, means circuit elements from the plurality of bins may be moved to a same bin during an iteration of a placement operation. In illustration, two bins, e.g., a first bin and a second bin, are said to be "utilization dependent" if a circuit element within the first bin and a circuit element within the second bin may be moved to a same bin during an iteration of a placement operation given the legal movements shown in FIG. 3. For example, bin C3 is utilization dependent with bin D4. Given the range of legal moves, a circuit element within bin C3 and a circuit element within bin D4, for example, both may be moved to either bin C4 or to bin D3.

By comparison, as defined within this specification, the term "utilization independent," in reference to a plurality of bins, means circuit elements from the plurality of bins may not be moved to a same bin during an iteration of a placement operation. In illustration, two bins, e.g., a first bin and a second bin, are said to be "utilization independent" if a circuit element within the first bin and a circuit element within the second bin may not be moved to a same bin during an iteration of a placement operation given the legal movements illustrated in FIG. 3. For example, bin A1 is utilization independent of bin C3. Given the range of legal moves, a circuit element within bin A1 may not be moved to any bin that a circuit element from bin C3 may be moved.

FIG. 4 illustrates exemplary IC 300 with bins grouped into bin sets. As defined within this specification, the term "bin set" means a plurality of bins that are utilization independent. As pictured, the bins of IC 300 are labeled with bin set identifiers (IDs) of A, B, C, D, E, F, G, and H. Bins with the same bin set ID are utilization independent of one another. For example, a circuit element in each any one of bins A may not be moved to a bin to which an element from another one of bins A may be moved when the movement of the circuit elements is restricted to the legal movements illustrated in FIG. 3.

Figure 5:
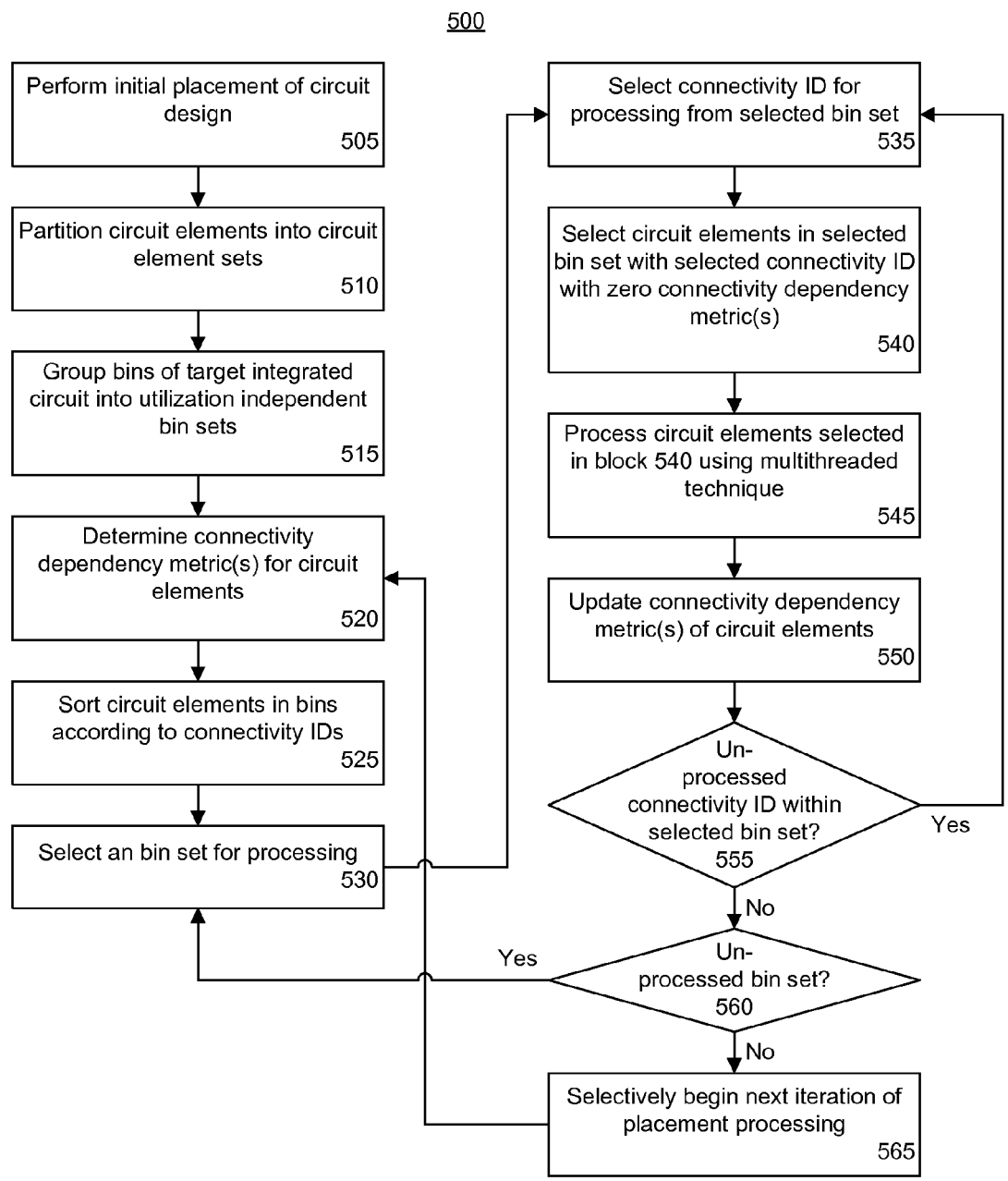
FIG. 5 is a flow chart illustrating an exemplary method of scheduling placement operations.

FIG. 5 is a flow chart illustrating an exemplary method 500 of scheduling placement operations. Method 500 may be performed by a system as described with reference to FIG. 2 operating on a circuit design. Method 500 may begin in a state where a circuit design has undergone synthesis and technology mapping. The next phase of the design flow is placement. As discussed, placement may include a global placement process and a detailed placement process. Method 500 is directed to scheduling placement operations for a placement process such as a global placement process. In one aspect, method 500 is utilized in conjunction with ILR.

In block 505, the system performs an initial placement of the circuit design. In one aspect, the initial placement may be an initial global placement. The system assigns the circuit elements of the circuit design to initial locations on the target IC. The assignment of initial locations may be random or may be performed using a cost metric such as wire length, timing, wire length and timing, or the like. As discussed, the initial placement may not be a legal placement as one or more circuit elements may be assigned to overlapping locations or to same locations of the target IC.

In block 510, the system partitions circuit elements into circuit element sets. The system partitions circuit elements into circuit element sets using connectivity. In one aspect, connectivity is determined using metrics such as timing and wire length. A first circuit element and a second circuit element are considered connectivity independent when moving the first circuit element, the second circuit element, or both the first and second circuit elements does not result in a change in timing or wire length as determined using a timing cost or a wire length cost, respectively. Circuit elements that are connectivity independent with respect to one another are partitioned in, or assigned to, the same circuit element set. Thus, as defined herein, the term "circuit element set" means two or more circuit elements that are connectivity independent of one another. Two circuit elements that are not part of the same net, for example, will be connectivity independent of one another. Moving one circuit element a net only changes the timing for that net. Similarly, since each net may be represented by bounding box, changing one circuit element only changes the bounding box of that net. In view of the foregoing, circuit elements in different nets do not relate to one another and may be processed independently.

As part of the partitioning of block 510, the system assigns a connectivity identifier (ID) to each circuit element set. Within this specification, the term connectivity ID is synonymous with a circuit element set. Each connectivity ID uniquely identifies a particular circuit element set. It should be appreciated that each circuit element is considered to be assigned, or associated with, the connectivity ID of the circuit element set having the circuit element as a member.

In block 515, the system groups bins of the target IC into bin sets. The system, for example, may divide the target IC into bins. Each bin may be rectangular in shape. In one aspect, each bin is square in shape. The system determines which bins are utilization independent and groups those bins together. As part of the grouping of block 515, the system assigns utilization dependency IDs to bins according to bin set. Each bin that is a member of a same bin set has a same utilization dependency ID. As such, utilization dependency IDs are synonymous with bin sets. Each utilization dependency ID uniquely identifies a particular bin set. Subsequent to performing block 515, the target IC is mapped into bin sets as pictured in FIG. 4. It should be appreciated that each bin includes one or more circuit elements from the initial placement of block 505.

In block 520, the system determines one or more connectivity dependency metrics for the circuit elements. In one aspect, for a given circuit element, the particular connectivity dependency metric, or metrics, used for the given circuit element may differ according to the number of circuit elements that are members of the same net as the given circuit element. In one example, circuit elements may be assigned a connectivity dependency ID as the connectivity dependency metric. In another example, circuit elements may be assigned a net ID as the connectivity dependency metric. In still another example, circuit elements may be assigned both a connectivity dependency ID and a net ID as the connectivity dependency metrics. The connectivity dependency metrics are described in greater detail with reference to FIG. 6.

In block 525, the system sorts circuit elements in the bins according to the connectivity IDs. In one aspect, the circuit elements may be sorted in increasing connectivity ID order. In block 530, the system selects a bin set for processing. In block 535, the system selects a connectivity ID for processing from the selected bin set.

In block 540, the system selects one or more circuit elements for processing. More particularly, of the circuit elements in the selected bin set from block 530, having the selected connectivity ID from block 535, those circuit elements also having a connectivity dependency metric of zero are selected for processing. Among the other noted conditions, for circuit elements only having a connectivity dependency ID, the circuit elements must have a connectivity dependency ID of zero to be selected in block 540. Among the other noted conditions, for circuit elements having only a net ID, the net ID must be zero to be selected in block 540. Among the other noted conditions, for those circuit elements having both a connectivity dependency ID and a net ID, the circuit elements must have a connectivity dependency ID of zero and a net ID of zero to be selected in block 540.

In block 545, the system processes the circuit elements selected in block 540 using a multithreaded technique. By using a multithreaded technique, the circuit elements identified in block 540 may be processed concurrently. Each of the circuit elements may be selectively moved or relocated to a bin or remain in the same bin in accordance with the set of legal movements of FIG. 3 based upon the cost of moving the circuit element. For example, each selected circuit element may be moved to a bin above, below, to the left, or to the right of the current bin. Further, as noted, circuit elements may remain in their current bin. The decision to move an element is based upon the cost determined for each legal move, e.g., for the bin above, for the bin below, for the bin to the left, for the bin to the right, and for the current bin. Each circuit element is moved to, or kept in, the particular bin determined to have the lowest cost. Cost may be determined using wire length, whether the circuit element overlaps another circuit element, e.g., is a legal placement, or the like. Any of a variety of known costs for placement may be used.

The order in which circuit elements are operated upon may be determined from blocks 530, 535, and 540. The plurality of circuit elements selected in block 540 may be operated upon concurrently, e.g., using multithreading. The bin sets and connectivity IDs ensure that the placement process as performed using multithreading is repeatable. For example, while circuit elements are processed concurrently, bin sets are selected and processed serially.

During block 545, one or more additional restrictions may be imposed to ensure repeatability of the placement process. For example, while operating on circuit elements in block 545, e.g., during a single iteration, the system may operate on at most one circuit element from each bin of the selected bin set concurrently. In another example, while operating on circuit elements in block 545, e.g., during a single iteration, the system may operate on at most one circuit element of a net concurrently.

In block 550, the system updates the connectivity dependency metrics of the circuit elements. In general, one or more of the connectivity dependency metrics are reduced. Updating of the connectivity dependency metrics is discussed in greater detail with reference to FIG. 7. Reducing the connectivity dependency metrics ensures that other circuit elements will have connectivity dependency metrics of zero value that are available for processing in subsequent iterations.

In block 555, the system determines whether any unprocessed connectivity IDs remain within the selected bin set. If so, method 500 loops back to block 535 where a next connectivity ID is selected within the current bin set. If not, method 500 continues to block 560.

In block 560, the system determines whether any unprocessed bin sets remain. If so, method 500 loops back to block 530 to select a next bin set for processing. If not, method 500 continues to block 565. In block 565, the system selectively begins a next iteration of placement processing. For example, the system may selectively begin a next iteration of ILR.

In one aspect, the determination of whether to begin a next iteration of placement processing may depend upon one or more exit criteria. The exit criteria may include determining that a placement quality metric has not improved by a sufficient amount when comparing the quality metric from a prior iteration of the placement process with the quality metric from the most recent iteration. The exit criteria, for example, may be determining that wire length has not improved by a minimum amount. Another example of exit criteria may include the inability to legalize a placement for a circuit design, or the like.

Responsive to determining that an exit criterion is not met, method 500 loops back to block 520 after block 565 to continue processing. In block 520, the system determines the connectivity dependency metrics previously described anew. The connectivity ID remains unchanged, e.g., static, for subsequent iterations. The bin sets need not be re-determined for each iteration. It should be appreciated, however, that since the particular circuit elements within the bins change from one iteration to the next, utilization dependency, e.g., bin sets, are dynamic in nature particularly when considering the circuit elements located therein.

Figure 6:
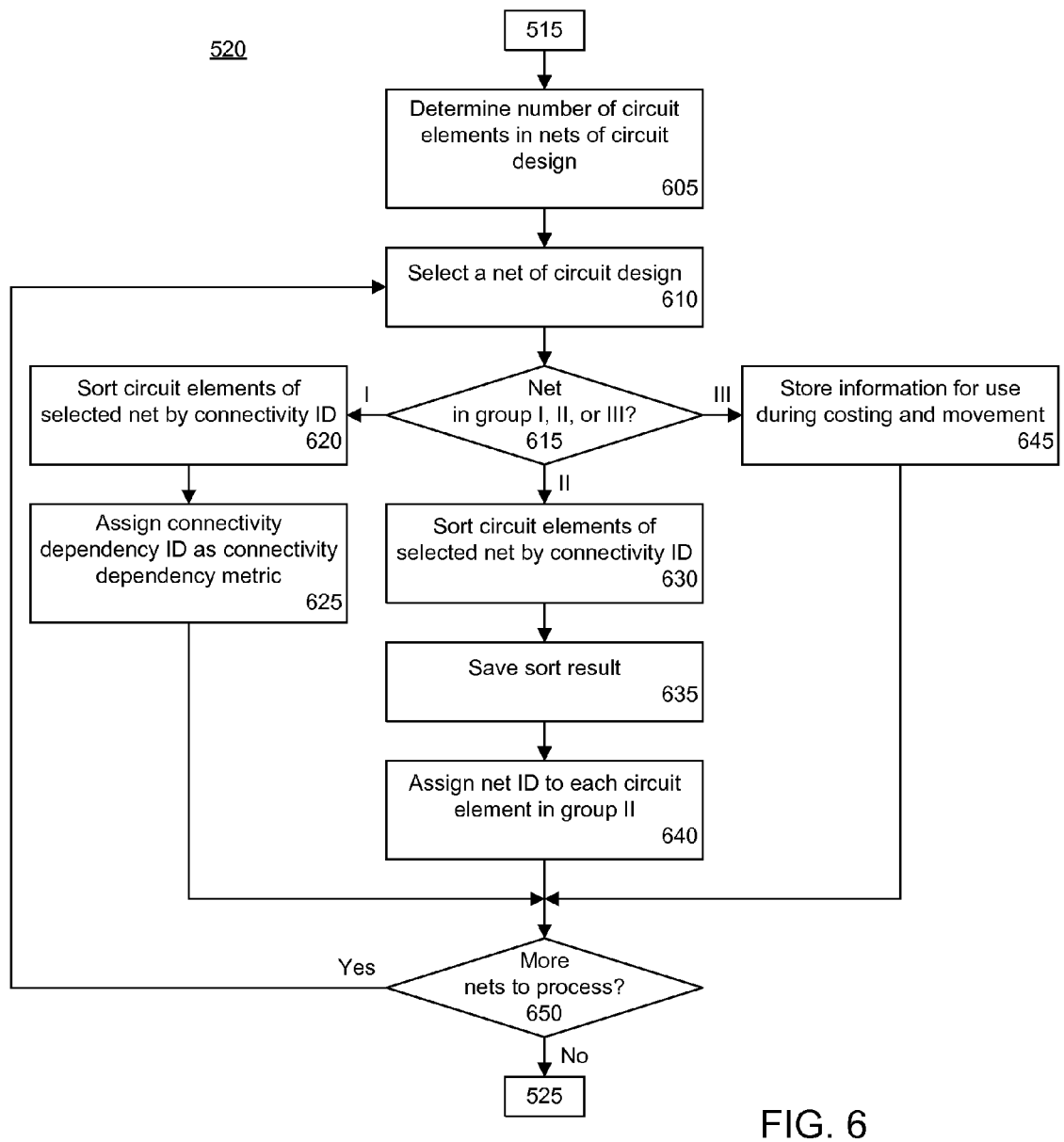
FIG. 6 is a flow chart illustrating an exemplary implementation of block 520 of FIG. 5.

FIG. 6 is a flow chart illustrating an exemplary implementation of block 520 of FIG. 5. In block 605, the system determines the number of circuit elements in nets of the circuit design. In one aspect, the system may determine the number of circuit elements in each net of the circuit design.

In block 610, the system selects a net of the circuit design.

In block 615, the system determines whether the net is within one of three different groups referred to as group I, group II, or group III. Group I may include any net having "X" or fewer circuit elements, where X is an integer value. For purposes of illustration, the number of circuit elements may be represented by "N." Thus, group I may include nets where $N \leq X$. Group II may include any net having more than X circuit elements and less than "Y" circuit elements where Y is an integer value greater than X. Thus, group II may include nets in a range, where the range is defined by $X<N<Y$. Group III may include any net having Y or more circuit elements. Thus, group III may include nets where $N \geq Y$.

Responsive to determining that the selected net is in group I, the method continues to block 620. In block 620, the system sorts the circuit elements of the selected net according to connectivity ID. In illustration, consider a net including circuit element A having a connectivity ID of 1, circuit element B having a connectivity ID of 0, and a circuit element C having a connectivity ID of 2. The circuit elements, being part of the same net, have different connectivity IDs indicating that the circuit elements are not considered connectivity independent. In one aspect, the system may sort the circuit elements according to increasing connectivity IDs. Sorting the circuit elements according to increasing connectivity ID results in the ordering B, A, and C.

In block 625, the system assigns each circuit element of the selected net a connectivity dependency ID as the connectivity dependency metric. The circuit elements may be assigned connectivity dependency IDs based on the sequential sort order where circuit element B has a connectivity dependency ID of 0, circuit element A has a connectivity dependency ID of 1, and circuit element C has a connectivity dependency ID of 2. That since the connectivity dependency ID is used to ensure repeatability of the multithreaded processing in block 545 of FIG. 5, the circuit elements may be sorted according to decreasing connectivity ID and assigned connectivity dependency IDs based upon the decreasing sort. After block 625, the method continues to block 650.

Responsive to determining that the selected net is in group II, the method continues to block 630. In block 630, the system sorts the circuit elements of the net according to connectivity ID. The circuit elements of the selected net may be sorted according to increasing or decreasing connectivity ID. It should be appreciated that the same sort order based upon connectivity ID, e.g., increasing or decreasing, used for block 620 is used in block 630 for purposes of repeatability and consistency.

In block 635, the sort result is saved for the selected net. In one example, the sort result is saved as a vector for the net. The term "vector" is used to refer to a data structure that stores the sort order or ordering of circuit elements of the selected net from block 630. In block 640, the system assigns a net ID to each circuit element of the net. For example, for each circuit element in the vector, the system assigns a net ID to the circuit element. The net IDs may be stored with the circuit elements in the vector or independently of the vector while still remaining associated with the corresponding circuit elements. In one aspect, the net ID for a circuit element specifies the number of nets in group II that the circuit element belongs, e.g., is a member. A circuit element may be a member of more than one net considered part of group II. As such, the circuit element may be listed in more than one vector of circuit elements for nets within group II. The net ID indicates the number of nets of group II to which the circuit element belongs.

In assigning net IDs to the circuit elements, it should be appreciated that one or more circuit elements that are members of group II nets may also be a member of a group I and/or a group III net. For example, a circuit element that is a member of only a net in group I will be assigned a connectivity dependency ID only. A circuit element that is a member of only a net in group I and a net in group II will be assigned both a connectivity dependency ID and a net ID. A circuit element that is a member of only nets in group II will be assigned a net ID only.

Responsive to determining that the selected net is in group III, the method continues to block 645. Circuit elements in group III are treated as independent circuit elements. In one aspect, the circuit elements are considered to a connectivity dependency ID of zero and a net ID of zero. In another aspect, the circuit elements that are members of nets in group III may be assigned a connectivity dependency ID of zero and a net ID of zero. If, however, a circuit element is a member of a net in group III and a net in group I and/or group II, that circuit element is assigned a non-zero connectivity dependency ID from the group I processing and/or a non-zero net ID from the group II processing as the case may be.

In block 645, the system stores the information for the net for later use during costing and movement, e.g., for use in block 545. In one aspect, the information may be cached. Storing the information for a net belonging to group III ensures repeatability. It should be appreciated that nets in group III are not sorted using connectivity ID as are nets in groups I or II because nets belonging to group III are considered independent for purposes of scheduling.

In block 650, the system determines whether any nets of the circuit design remain to be processed. If so, the method loops back to block 610 to select a next net for processing. If not, the method continues to block 525 of FIG. 5.

Figure 7:
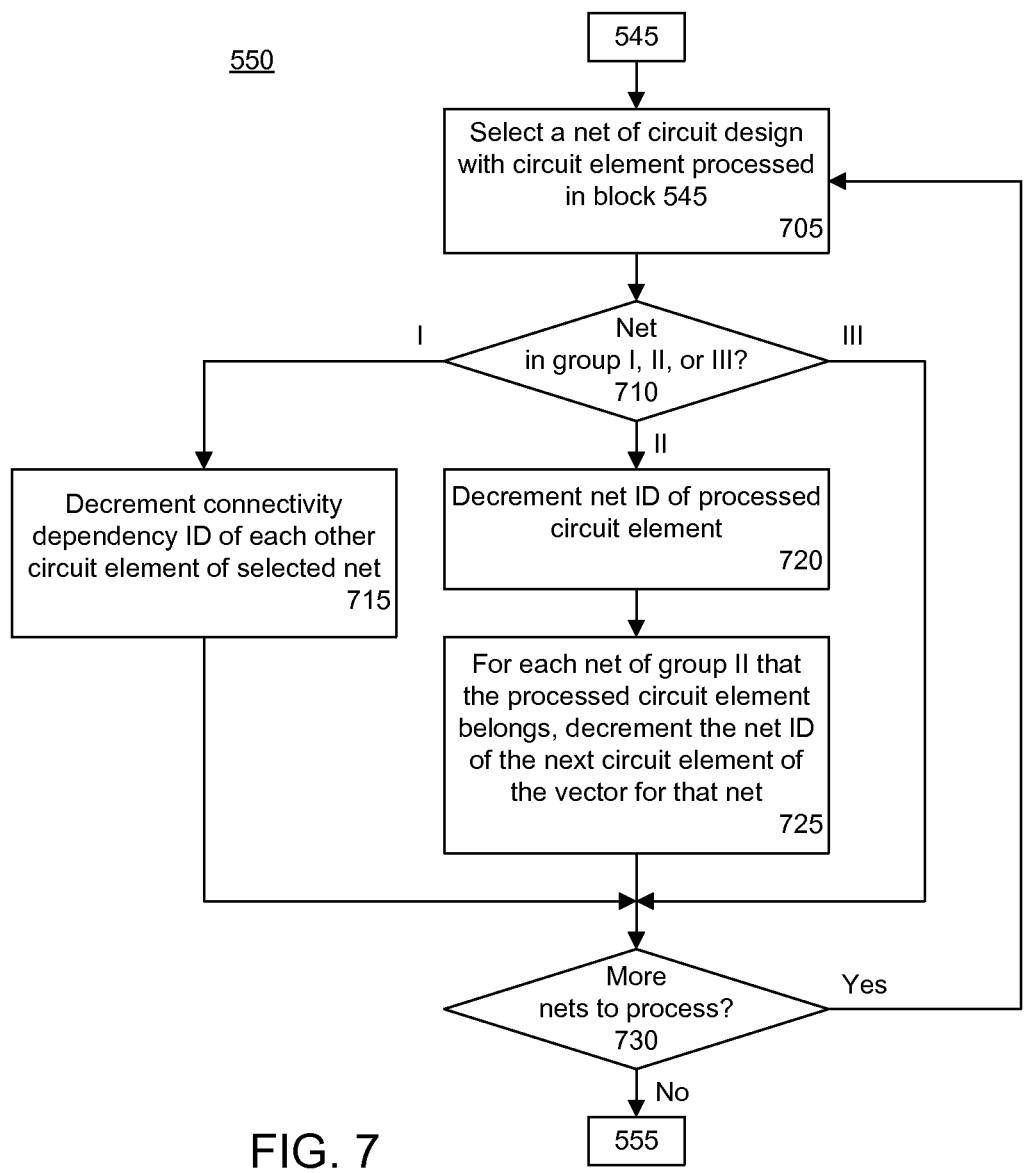
FIG. 7 is a flow chart illustrating an exemplary implementation of block 550 of FIG. 5.

FIG. 7 is a flow chart illustrating an exemplary implementation of block 550 of FIG. 5. In block 705, the system selects a net of the circuit design that includes a circuit element processed in block 545. In block 710, the system determines whether the net is in group I, group II, or group III.

Responsive to determining that the net belongs to group I, the system proceeds to block 715. In block 715, the system decrements the connectivity dependency ID of each other circuit element of the selected net. In order for a circuit element of group I to be processed in block 545, the connectivity dependency must be zero. Accordingly, the processed circuit element of the selected net must have a connectivity dependency ID of zero. Block 715 ensures that the connectivity dependency IDs of the other circuit elements of the selected net are decremented. Only when a circuit element has a connectivity dependency ID of zero may that circuit element be processed in block 545 to ensure repeatability. After block 715, the method proceeds to block 730.

Responsive to determining that the net belongs to group II, the system proceeds to block 720. In block 720, the system decrements the net ID of the circuit element of the selected net processed in block 545. In block 725, for each net belonging to group II of which the processed circuit element (from block 720) is also a member, the system decrements the net ID of the next circuit element in the vector for the net. In the case of group II nets, a circuit element may only be processed when the net ID of that circuit element is zero. Decrementing the net IDs as described ensures repeatability of the placement process while multithreading. After block 725, the method continues to block 730.

Responsive to determining that the selected net belongs to group III, the system proceeds to block 730. Since circuit elements of nets in group III are treated as independent circuit elements, the circuit elements may be processed in parallel. During the consolidation phase after moving multiple blocks of a group III net, the consolidation may be performed sequentially to avoid data race conditions.

In block 730, the system determines whether any further nets remain to be processed. In one aspect, the system only determined whether any further nets remain to be processed of the nets having a circuit element that was processed in block 545. If one or more nets remain to be processed, the method loops back to block 705 to process further nets. If no further nets remain to be processed, the method continues to block 555 to continue processing as described with reference to FIG. 5.

FIGS. 6 and 7 illustrate exemplary implementations of blocks 520 and 550, respectively. The particular operations described and the order of the operations is not intended to be limiting. In this regard, the particular values used for X and Y may be dependent upon the size of the target device, the size of the circuit design, and designer preference.

In another aspect, the different handling of according to size of nets in blocks 520 and 550 may be optional. For example, in one aspect, all nets of the circuit design may be processed as a group I net. In another aspect, all nets of the circuit design may be processed as a group II net.

In accordance with the inventive arrangements disclosed herein, placement operations may be performed for a circuit design using a scheduling technique that facilitates multi-threaded operation. The scheduling technique utilizes connectivity dependency and utilization dependency to increase the amount of multithreading that may be achieved. In consequence, the placement process is able to scale to larger circuit designs and complete in less time than other conventional techniques where utilization dependency is not used.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The term "scheduling," as defined herein, means a method by which threads, processes, operations, etc., are given access to resources such as processor time. As defined herein, the term "output," means storing in a memory, transferring from one physical system and/or memory to another physical system and/or memory, transmitting, or the like.

As defined herein, the term "hardware description language" is a computer-language that facilitates the documentation, design, and manufacturing of a digital system, such as an IC. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

As defined herein, the term "automatically" means without user intervention. As defined herein, the term "user" means a human being. The term "and/or" as defined herein means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure may be realized in hardware or a combination of hardware and software. One or more aspects may be realized in a centralized fashion in one system or in a distributed fashion where different elements are spread across several interconnected systems. Any kind of data processing system or other apparatus adapted for carrying out at least a portion of the methods described herein is suited.

One or more aspects further may be embedded in a computer program product, which includes all the features enabling the implementation of the methods described herein. The computer program product includes a computer-readable data storage medium. As defined herein, the phrase "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code may include, but is not limited to, a subroutine, a function, a procedure, an object method, an object implementation, an executable application, an applet, a servlet, source code, object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A method of placing a circuit design may include partitioning circuit elements of the circuit design into circuit element sets, grouping bins of an IC into bin sets, wherein the bins include circuit elements of the circuit design from an initial placement, and determining a dependency connectivity metric for the circuit elements. The method also may include, using a processor, selectively relocating circuit elements concurrently, for a plurality of iterations, using an order of processing the circuit elements determined from the bin sets, the circuit element sets, and the dependency connectivity metrics.

In one aspect, the bin sets may be serially processed and only the connectivity dependency metrics are updated for each of the plurality of iterations.

Selectively relocating circuit elements of the selected bin set may include operating on at most one circuit element from each bin of a selected bin set concurrently for the selectively relocating and operating on at most one circuit element of a net concurrently for the selectively relocating.

Determining a connectivity dependency metric for the circuit elements may include, for each net having fewer than a maximum number of circuit elements, sorting the circuit elements of the net according to membership in circuit element sets and assigning a connectivity dependency ID derived from the sorting to each circuit element of the net.

Selectively relocating circuit elements of the selected bin set may include operating only upon circuit elements in the selected bin set having connectivity dependency IDs of zero and responsive to operating upon a circuit element having a connectivity dependency ID of zero, decrementing the connectivity dependency ID of each other circuit element belonging to a same net as the operated upon circuit element.

Determining a connectivity dependency metric for the circuit elements may include, for each net having a number of circuit elements within a defined range, sorting the circuit elements of the net into a vector and assigning, to each circuit element of the net, a net ID specifying a number of nets to which the circuit element belongs that have a number of circuit elements within the defined range.

The method may also include, responsive to operating upon a selected circuit element having a net ID of zero, for each other net having a number of circuit elements within the defined range and of which the selected circuit element is a member, decrementing the net ID of a next circuit element in the vector.

A system may include a processor programmed to initiate executable operations. The executable operations may include partitioning circuit elements of the circuit design into circuit element sets, grouping bins of an IC into bin sets, wherein the bins comprise circuit elements of the circuit design from an initial placement, and determining a dependency connectivity metric for the circuit elements. The executable operations may also include selectively relocating circuit elements concurrently, for a plurality of iterations, using an order of processing the circuit elements determined from the bin sets, the circuit element sets, and the dependency connectivity metrics.

In one aspect, the bin sets are serially processed and only the connectivity dependency metrics are updated for each of the plurality of iterations.

Selectively relocating circuit elements of the selected bin set may include operating on at most one circuit element from each bin of a selected bin set concurrently for the selectively relocating and operating on at most one circuit element of a net concurrently for the selectively relocating.

Determining a connectivity dependency metric for the circuit elements may include, for each net having fewer than a maximum number of circuit elements, sorting the circuit elements of the net according to membership in circuit element sets and assigning a connectivity dependency ID derived from the sorting to each circuit element of the net.

Selectively relocating circuit elements of the selected bin set may include operating only upon circuit elements in the selected bin set having connectivity dependency IDs of zero and, responsive to operating upon a circuit element having a connectivity dependency ID of zero, decrementing the connectivity dependency ID of each other circuit element belonging to a same net as the operated upon circuit element.

Determining a connectivity dependency metric for the circuit elements may include, for each net having a number of circuit elements within a defined range, sorting the circuit elements of the net into a vector and assigning, to each circuit element of the net, a net ID specifying a number of nets to which the circuit element belongs that have a number of circuit elements within the defined range.

The processor may also be programmed to initiate executable operations including, responsive to operating upon a selected circuit element having a net ID of zero, for each other net having a number of circuit elements within the defined range and of which the selected circuit element is a member, decrementing the net ID of a next circuit element in the vector.

A non-transitory computer-readable storage medium includes instructions stored thereon which, when executed by a processor, perform a method. The method may include partitioning circuit elements of the circuit design into circuit element sets, grouping bins of an IC into bin sets, wherein the bins include circuit elements of the circuit design from an initial placement, and determining a dependency connectivity metric for the circuit elements. The method may also include selectively relocating circuit elements concurrently, for a plurality of iterations, using an order of processing the circuit elements determined from the bin sets, the circuit element sets, and the dependency connectivity metrics.

In one aspect, the bin sets are serially processed and only the connectivity dependency metrics are updated for each of the plurality of iterations.

Selectively relocating circuit elements of the selected bin set may include operating on at most one circuit element from each bin of a selected bin set concurrently for the selectively relocating and operating on at most one circuit element of a net concurrently for the selectively relocating.

Determining a connectivity dependency metric for the circuit elements may include, for each net having fewer than a maximum number of circuit elements, sorting the circuit elements of the net according to membership in circuit element sets and assigning a connectivity dependency ID derived from the sorting to each circuit element of the net.

Selectively relocating circuit elements of the selected bin set may include operating only upon circuit elements in the selected bin set having connectivity dependency IDs of zero and responsive to operating upon a circuit element having a connectivity dependency ID of zero, decrementing the connectivity dependency ID of each other circuit element belonging to a same net as the operated upon circuit element.

Determining a connectivity dependency metric for the circuit elements may include, for each net having a number of circuit elements within a defined range, sorting the circuit elements of the net into a vector, assigning, to each circuit element of the net, a net ID specifying a number of nets to which the circuit element belongs that have a number of circuit elements within the defined range, and responsive to operating upon a selected circuit element having a net ID of zero, for each other net having a number of circuit elements within the defined range and of which the selected circuit element is a member, decrementing the net ID of a next circuit element in the vector.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. A method of placing a circuit design, comprising:
   partitioning circuit elements of the circuit design into circuit element sets, wherein each circuit element set includes circuit elements that are connectivity independent of one another;
   grouping bins of an integrated circuit into bin sets, wherein the bins comprise circuit elements of the circuit design from an initial placement, and each bin set comprises a plurality of bins that are utilization independent;
   determining a dependency connectivity metric for the circuit elements, wherein the dependency connectivity metric is a value indicating at least one of membership of the circuit element in a particular circuit element set or a number of nets to which the circuit element belongs; and
   using a processor, selectively relocating, from first bins to legal bins based on a cost, circuit elements of a same bin set, a same circuit element set, and that have a selected value of the dependency connectivity metric concurrently in a plurality of threads.

2. The method of claim 1, wherein the bin sets are serially processed and only the connectivity dependency metrics are updated for each of the plurality of iterations.

3. The method of claim 1, wherein selectively relocating circuit elements of the selected bin set comprises:
   operating on at most one circuit element from each bin of a selected bin set concurrently for the selectively relocating; and
   operating on at most one circuit element of a net concurrently for the selectively relocating.

4. The method of claim 1, wherein determining a connectivity dependency metric for the circuit elements comprises, for each net having fewer than a maximum number of circuit elements:
   sorting the circuit elements of the net according to membership in circuit element sets; and
   assigning a connectivity dependency identifier derived from the sorting to each circuit element of the net.

5. The method of claim 4, wherein selectively relocating circuit elements of the selected bin set comprises:
   operating only upon circuit elements in the selected bin set having connectivity dependency identifiers of zero; and
   responsive to operating upon a circuit element having a connectivity dependency identifier of zero, decrementing the connectivity dependency identifier of each other circuit element belonging to a same net as the operated upon circuit element.

6. The method of claim 1, wherein determining a connectivity dependency metric for the circuit elements comprises, for each net having a number of circuit elements within a defined range:
   sorting the circuit elements of the net into a vector; and
   assigning, to each circuit element of the net, a net identifier specifying a number of nets to which the circuit element belongs that have a number of circuit elements within the defined range.

7. The method of claim 6, further comprising:
   responsive to operating upon a selected circuit element having a net identifier of zero, for each other net having a number of circuit elements within the defined range and of which the selected circuit element is a member, decrementing the net identifier of a next circuit element in the vector.

8. A system, comprising:
   a processor programmed to initiate executable operations comprising:
   partitioning circuit elements of the circuit design into circuit element sets, wherein each circuit element set includes circuit elements that are connectivity independent of one another;
   grouping bins of an integrated circuit into bin sets, wherein the bins comprise circuit elements of the circuit design from an initial placement, and each bin set comprises a plurality of bins that are utilization independent;
   determining a dependency connectivity metric for the circuit elements, wherein the dependency connectivity metric is a value indicating at least one of membership of the circuit element in a particular circuit element set or a number of nets to which the circuit element belongs; and
   selectively relocating, from first bins to legal bins based on a cost, circuit elements of a same bin set, a same circuit element set, and that have a selected value of the dependency connectivity metric concurrently in a plurality of threads.

9. The system of claim 8, wherein the bin sets are serially processed and only the connectivity dependency metrics are updated for each of the plurality of iterations.

10. The system of claim 8, wherein selectively relocating circuit elements of the selected bin set comprises:
    operating on at most one circuit element from each bin of a selected bin set concurrently for the selectively relocating; and
    operating on at most one circuit element of a net concurrently for the selectively relocating.

11. The system of claim 8, wherein determining a connectivity dependency metric for the circuit elements comprises, for each net having fewer than a maximum number of circuit elements:
    sorting the circuit elements of the net according to membership in circuit element sets; and
    assigning a connectivity dependency identifier derived from the sorting to each circuit element of the net.

12. The system of claim 11, wherein selectively relocating circuit elements of the selected bin set comprises:
    operating only upon circuit elements in the selected bin set having connectivity dependency identifiers of zero; and
    responsive to operating upon a circuit element having a connectivity dependency identifier of zero, decrementing the connectivity dependency identifier of each other circuit element belonging to a same net as the operated upon circuit element.

13. The system of claim 8, wherein determining a connectivity dependency metric for the circuit elements comprises, for each net having a number of circuit elements within a defined range:
   sorting the circuit elements of the net into a vector; and
   assigning, to each circuit element of the net, a net identifier specifying a number of nets to which the circuit element belongs that have a number of circuit elements within the defined range.

14. The system of claim 13, wherein the processor is further programmed to initiate executable operations comprising:
   responsive to operating upon a selected circuit element having a net identifier of zero, for each other net having a number of circuit elements within the defined range and of which the selected circuit element is a member, decrementing the net identifier of a next circuit element in the vector.

15. A non-transitory computer-readable storage medium having instructions stored thereon which, when executed by a processor, perform a method comprising:
   partitioning circuit elements of the circuit design into circuit element sets, wherein each circuit element set includes circuit elements that are connectivity independent of one another;
   grouping bins of an integrated circuit into bin sets, wherein the bins comprise circuit elements of the circuit design from an initial placement, and each bin set comprises a plurality of bins that are utilization independent;
   determining a dependency connectivity metric for the circuit elements, wherein the dependency connectivity metric is a value indicating at least one of membership of the circuit element in a particular circuit element set or a number of nets to which the circuit element belongs; and
   selectively relocating, from first bins to legal bins based on a cost, circuit elements of a same bin set, a same circuit element set, and that have a selected value of the dependency connectivity metric concurrently in a plurality of threads.

16. The non-transitory computer-readable storage medium of claim 15, wherein the bin sets are serially processed and only the connectivity dependency metrics are updated for each of the plurality of iterations.

17. The non-transitory computer-readable storage medium of claim 15, wherein selectively relocating circuit elements of the selected bin set comprises:
   operating on at most one circuit element from each bin of a selected bin set concurrently for the selectively relocating; and
   operating on at most one circuit element of a net concurrently for the selectively relocating.

18. The non-transitory computer-readable storage medium of claim 15, wherein determining a connectivity dependency metric for the circuit elements comprises, for each net having fewer than a maximum number of circuit elements:
   sorting the circuit elements of the net according to membership in circuit element sets; and
   assigning a connectivity dependency identifier derived from the sorting to each circuit element of the net.

19. The non-transitory computer-readable storage medium of claim 18, wherein selectively relocating circuit elements of the selected bin set comprises:
   operating only upon circuit elements in the selected bin set having connectivity dependency identifiers of zero; and
   responsive to operating upon a circuit element having a connectivity dependency identifier of zero, decrementing the connectivity dependency identifier of each other circuit element belonging to a same net as the operated upon circuit element.

20. The non-transitory computer-readable storage medium of claim 15, wherein determining a connectivity dependency metric for the circuit elements comprises, for each net having a number of circuit elements within a defined range:
   sorting the circuit elements of the net into a vector;
   assigning, to each circuit element of the net, a net identifier specifying a number of nets to which the circuit element belongs that have a number of circuit elements within the defined range; and
   responsive to operating upon a selected circuit element having a net identifier of zero, for each other net having a number of circuit elements within the defined range and of which the selected circuit element is a member, decrementing the net identifier of a next circuit element in the vector.

* * * * *